US012289869B2

(12) United States Patent
Gao (10) Patent No.: US 12,289,869 B2
(45) Date of Patent: Apr. 29, 2025

(54) DATA CENTER COOLING CAPACITY DISPATCHING AND MANAGEMENT

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 685 days.

(21) Appl. No.: 16/581,117

(22) Filed: Sep. 24, 2019

(65) Prior Publication Data
US 2021/0092874 A1 Mar. 25, 2021

(51) Int. Cl.
*H05K 7/20* (2006.01)

(52) U.S. Cl.
CPC ..... *H05K 7/20745* (2013.01); *H05K 7/20145* (2013.01); *H05K 7/20181* (2013.01); *H05K 7/2079* (2013.01); *H05K 7/20836* (2013.01)

(58) Field of Classification Search
CPC ........... H05K 7/20745; H05K 7/20145; H05K 7/20181; H05K 7/2079; H05K 7/20836; H05K 7/20727; H05K 7/20754
USPC ........................................................ 454/184
See application file for complete search history.

(56) References Cited

U.S. PATENT DOCUMENTS

| | | | | |
|---|---|---|---|---|
| 10,334,758 | B1* | 6/2019 | Ramirez | G06F 1/26 |
| 10,893,634 | B1* | 1/2021 | Russell | H05K 7/20836 |
| 10,921,868 | B2* | 2/2021 | Hay | F24F 1/0067 |
| 2010/0154448 | A1* | 6/2010 | Hay | F24F 1/0067 |
| | | | | 62/119 |
| 2015/0204566 | A1* | 7/2015 | Dawson | F24F 11/30 |
| | | | | 700/276 |
| 2019/0373779 | A1* | 12/2019 | Roy | H05K 7/20145 |
| 2020/0015389 | A1* | 1/2020 | Gao | F25B 25/005 |

* cited by examiner

Primary Examiner — Steven B McAllister
Assistant Examiner — Charles R Brawner
(74) Attorney, Agent, or Firm — WOMBLE BOND DICKINSON (US) LLP (57) ABSTRACT

A dynamically adjustable cooling system is discussed and a system configuration design method is disclosed for cooling airflow management and dispatching. The system includes a first and second IT rooms that include electronic racks with IT components. The system also includes cooling units configured to provide cooling air to the IT components. The system also includes a cooling air supply channel to distribute the cooling air to the IT components. The system also includes multiple louvers installed at different locations such as on supply ports of the cooling units, within the cooling air supply channel, and on entrance ports to the IT rooms which are used for configuring the airflow within the supply channel. Each louver is capable of being opened and closed independently to create multiple different air flow combinations for cooling the IT components.

16 Claims, 9 Drawing Sheets

DATA CENTER COOLING CAPACITY DISPATCHING AND MANAGEMENT

TECHNICAL FIELD

Embodiments of the present invention relate generally to data centers. More particularly, embodiments of the invention relate to cooling electronic racks in data centers.

BACKGROUND

Heat removal is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases as the temperature of their environment increases or out of the desired ranges. Maintaining a proper thermal environment is critical for normal operations of these servers in data centers, as well as the server performance and lifetime. Heat removal solutions are necessary to cool these high performance servers and IT equipment.

Power intensive processors enable the solution of intensive computing such as deep learning. Electrical servers having those processors, i.e., high-power central processing units (CPUs) and/or general-purpose or graphical processing units (GPUs), have a very high power density per volumetric space. Liquid cooling is one feasible thermal management solution for high power density. Generally, the data center workload is planned before the data center is built. However, in the actual deployment and operation, the workload may vary from the initial design.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Generally, the data center workload is planned before the data center is built. However, in the actual deployment and operation, the workload may vary from the initial design. This may require the cooling system for the data center to be able to adjust based on a varying work load. For example, the IT rack power and each data center room IT load may be determined and rated using peak power conditions. Based on the power and load determinations, the cooling system may be designed, including the type of cooling equipment, the amount of cooling equipment, and the layout of the cooling equipment. Traditionally, the cooling design for a data center provided a cooling system that was substantially fixed. A fixed number of cooling units have traditionally provided a fixed amount of cooling capacity for a given data center. This may be problematic if, after installation and deployment of the data center and cooling system, the IT load of the data center increases beyond what was originally planned. With the increase in computing power required across the globe, this problem is occurring more and more often. Because of the increased IT load and heat generated from the computing components, overheating is a serious concern.

To overcome or prevent the above issues from occurring, a dynamically adjustable cooling system may provide adjustable cooling to a data center and thus be able to effectively cool data center IT components in response to dynamic changes in the IT load without requiring any physical change on the infrastructure or cooling units. The dynamically adjustable cooling system may be made possible by providing a new configuration of cooling units, a cooling air supply channel, and multiple louvers installed at various locations throughout the cooling system to direct air flow or fluid flow. The cooling air supply channel may be used between the cooling units (e.g., IDEC cooling units) and the data center modules or the IT rooms. The idea is to be able to dispatch the cooling airflow from where it was design for to another space where it is actually needed. The air louvers may be positioned on the supply ports of the cooling units, on air inlets of the wall of the cooling air supply channel, as well as inside the air supply channel. By controlling the open and close status of the louvers, different cooling air channel configurations can be created for different cooling configurations needed in the data center rooms.

Multiple different configurations and designs are contemplated in this disclosure. Some of the configurations include using a standby unit for multiple rooms, introducing multiple mixed louvers within the cooling air supply channel, introducing a single mobile louver within the channel, among other configurations. In addition, different building level designs are contemplated in this disclosure and will be discussed in more detail herein. The dynamically adjustable cooling system may increase the efficiency and flexibility of any data center where the cooling system is deployed. It may allow the IT loads of the data center to go beyond what was initially planned.

Figure 1:
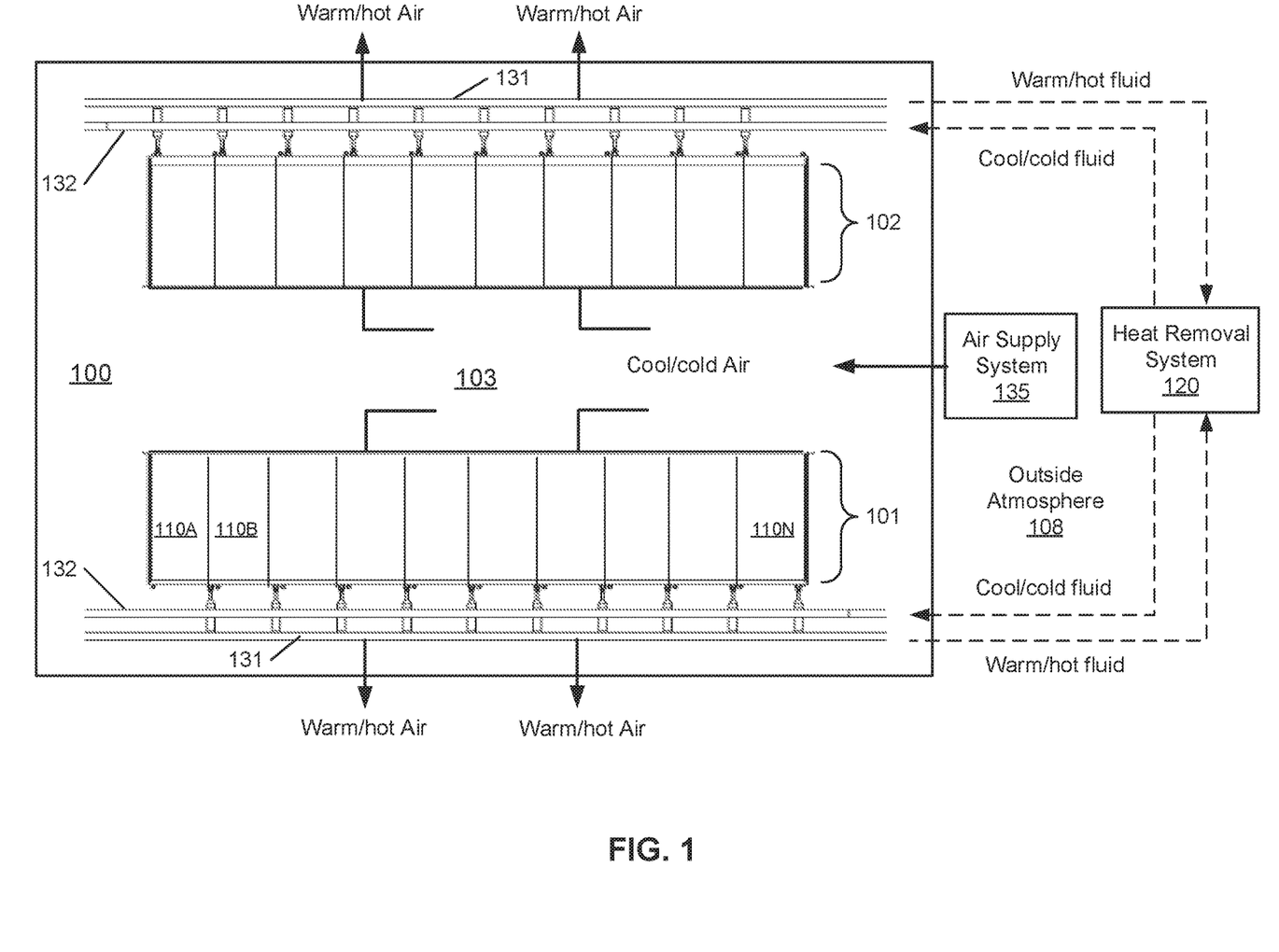
FIG. 1 is a block diagram illustrating an example of a data center facility according to one embodiment.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, including the integrated cooling module discussed herein, a number of server slots, and a number of server blades capable of being inserted into and removed from the server blades or server slots. Each server blade represents a computing node having one or more processors, a memory, and/or a persistent storage device (e.g., hard disk). At least one of the processors is attached to a liquid cold plate (also referred to as a cold plate assembly) to receive cooling liquid. In addition, one or more optional cooling fans are associated with the server blades to provide air cooling to the computing nodes contained therein. Note that the heat removal system 120 may be coupled to multiple data center systems such as data center system 100. The heat removal system removes a substantial amount of the heat generated within the data centers to the atmosphere.

In one embodiment, heat removal system 120 includes an external liquid loop connected to a cooling tower or a dry cooler external to the building/housing container. The heat removal system 120 can include, but is not limited to evaporative cooling, free air, and rejection to large thermal mass and waste heat recovery designs. In this disclosure, heat removal system 120 may also be referred to as cooling system. Heat removal system 120 may include or be coupled to a cooling liquid source that provide cooling liquid.

In one embodiment, each server blade is coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet connector is to emit warmer or hotter liquid carrying the heat exchanged from the processors to the heat removal liquid manifold via a second liquid outlet connector and then back to a coolant distribution unit (CDU) within the electronic rack.

Although this disclosure focuses on air flow management in an air-cooling system, other forms of cooling are available, such as liquid cooling. Or liquid cooling may be co-exiting with an air cooling solution for some data centers. As shown in FIG. 1, the room are designed with both cooling water and cooling air. For example, in one embodiment, an optional heat removal liquid manifold disposed on the backend of each electronic rack is coupled to liquid supply line 132 to receive heat removal liquid (also referred to as cooling liquid) from heat removal system 120. The heat removal liquid is distributed through a liquid distribution loop attached to a cold plate assembly on which a processor is mounted to remove heat from the processors. A cold plate is configured similar to a heat sink with a liquid distribution tube or channel attached or embedded therein. The resulting warmer or hotter liquid carrying the heat exchanged from the processors is transmitted via liquid return line 131 back to heat removal system 120. Liquid supply/return lines 131-132 are referred to as data center or room liquid supply/return lines (e.g., global liquid supply/return lines), which supply heat removal liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

In one embodiment, data center system 100 further includes an airflow delivery system 135 to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, air supply system 135 generates airflow of cool/cold air to circulate from aisle 103 through electronic racks 110A-110N to carry away exchanged heat. The cool airflows enter the electronic racks through their frontends and the warm/hot airflows exit the electronic racks from their backends. The warm/hot air with exchanged heat is exhausted from room/building. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling. Air supply system 135 can be connected to the heat removal system 120 to extract the heat to the atmosphere.

Figure 2:
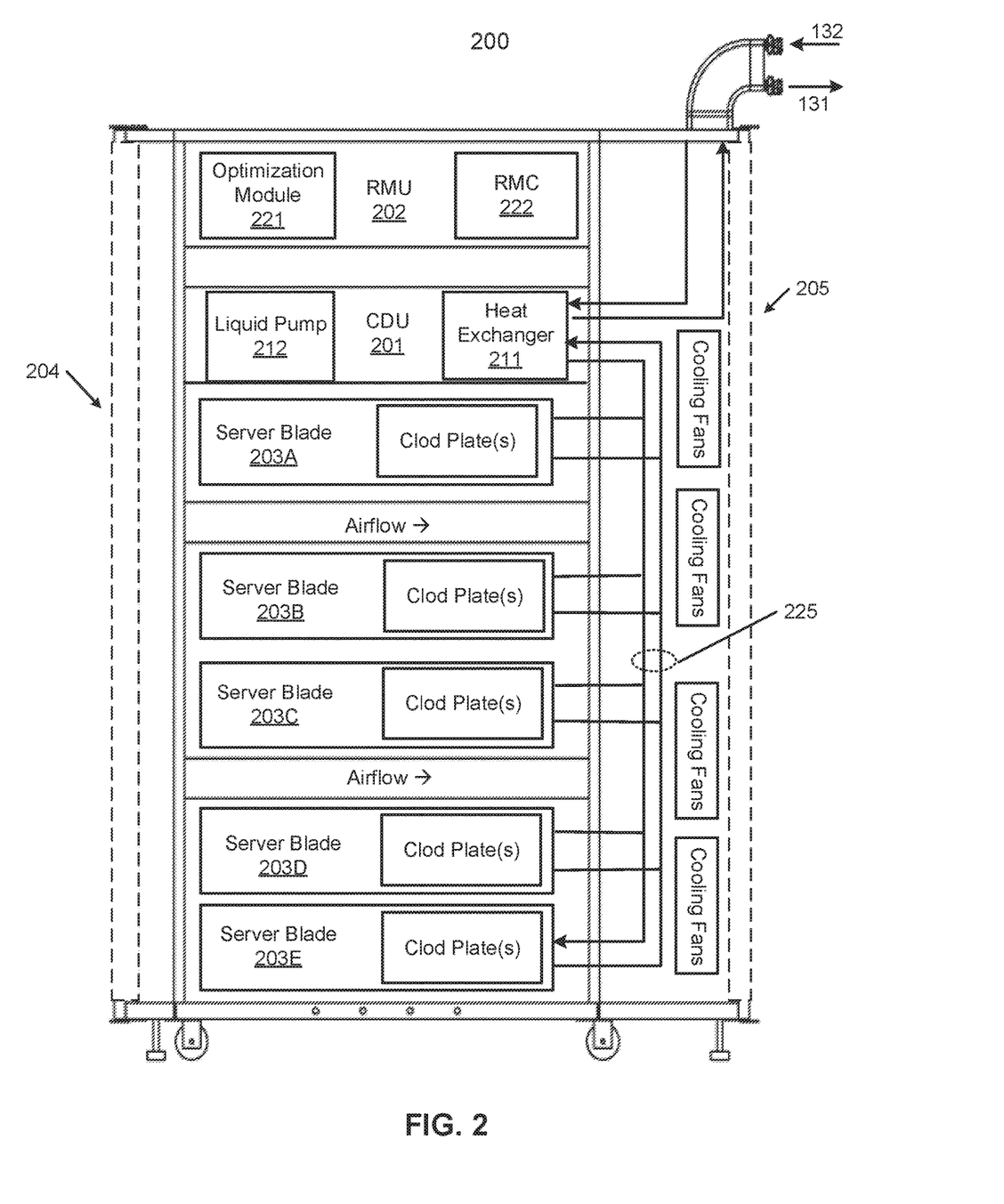
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, optional CDU 201, RMU 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 202, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container, as long as the cooling fans can generate airflows from the frontend to the backend.

In addition, for at least some of the server blades 203, an optional fan module (not shown) is associated with the server blade. Each of the fan modules includes one or more cooling fans. The fan modules may be mounted on the backends of server blades 203 or on the electronic rack to generate airflows flowing from frontend 204, traveling through the air space of the sever blades 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, are coupled to heat removal system 120 as described above. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 200 may optionally further include RMU 202 configured to provide and manage power supplied to servers 203 and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery unit, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and air temperatures, which may be captured and collected via various temperature sensors. The monitor may also receive data representing the fan power and pump power generated by the fan modules and liquid pump 212, which may be proportional to their respective speeds. These operating data are referred to as real-time operating data. Further, the monitor may further receive signals indicating whether liquid leak occurs in any of the server blades, for example from leak detectors and/or sensors (e.g., liquid sensors, temperature sensors). Note that the monitor may be implemented as a separate module within RMU 202.

Based on the operating data, optimization module 221 performs an optimization using a predetermined optimization function or optimization model to derive a set of optimal fan speeds for fan modules and an optimal pump speed for liquid pump 212, such that the total power consumption of liquid pump 212 and the fan modules reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server blades 203. Similarly, based on the optimal fan speeds, RMC 222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

As described above, each of the server blades includes a number of IT components such as processors or processing units that may generate heat during the operations. According to one embodiment, the IT components of each server blade are attached to an integrated cooling module having an array of cold plates arranged therein to be attached to an external surface of each of the IT components for heat exchange. The integrated cooling module is designed to be a single cooling module having cooling liquid distribution channels embedded therein to reduce a number of connection joints and parts, which in turn reduces the chances of liquid leaking, which will be described in details further below. The following figures and discussion discuss designs for various different dynamically adjustable cooling system configurations. Note that the figures presented below are simplified representations of the dynamically adjustable cooling system. Proportions are not meant to be to scale, and numbers and calculations related to the data center, IT rooms, IT racks, IT modules, louvers, cooling units, etc. are examples of the configurations and are not meant to be taken as technical specifications.

Figure 3:
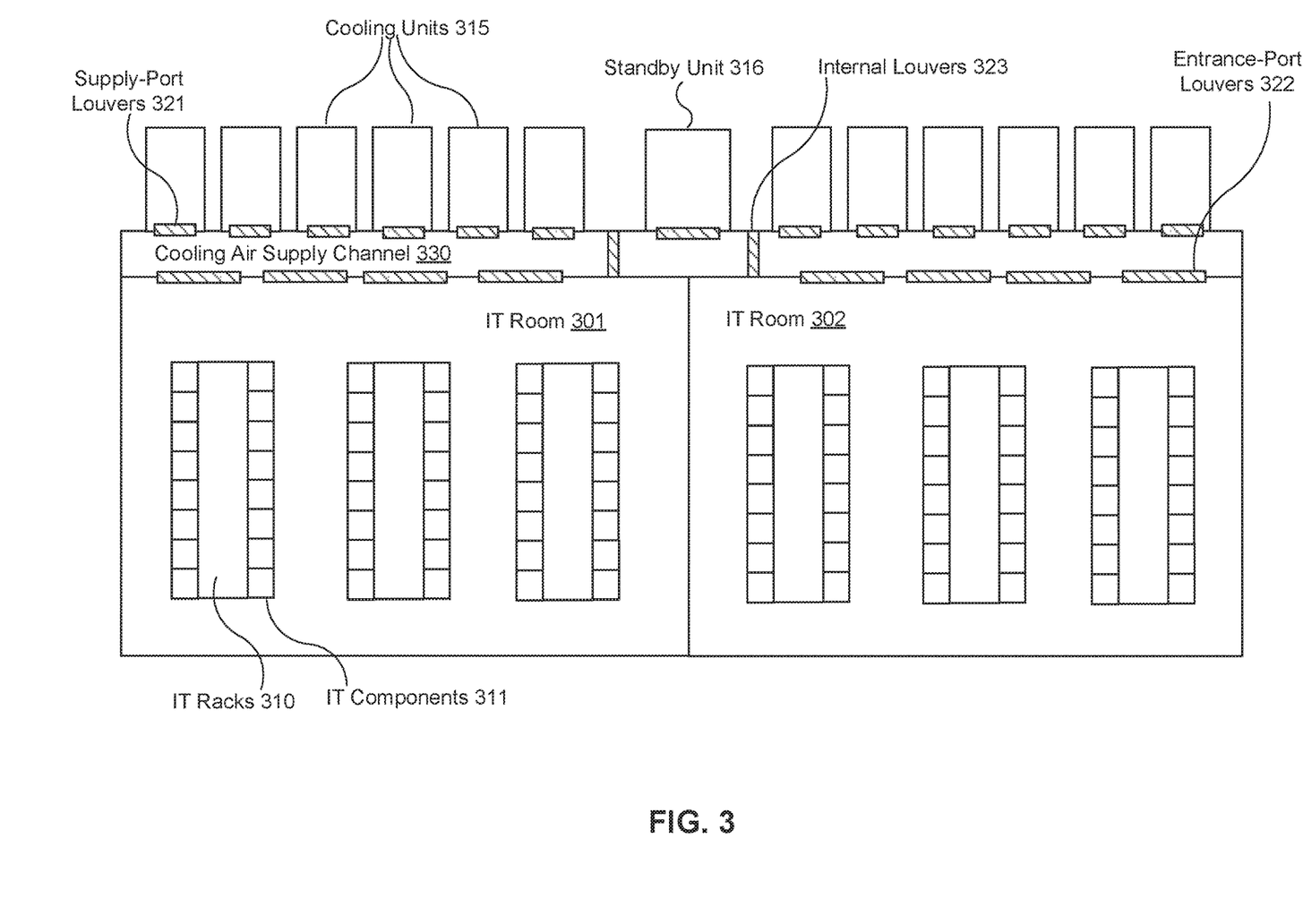
FIG. 3 is a block diagram illustrating an example dynamically adjustable cooling system according to one embodiment of the invention.

FIG. 3 is a block diagram illustrating an example dynamically adjustable cooling system according to one embodiment of the invention. This configuration may use a standby cooling unit 316 that may be positioned adjacent to multiple cooling units 315. The cooling units 315 may supply cooling air to the cooling air supply channel 330 by way of supply-port louvers 321. The cooling air supply channel 330 may extend the entire width of IT room 301 and IT room 302. The internal louvers 323 may be used for controlling the air flow supplied from the standby unit 316. All louvers 321, 322, and 323 may include vanes that allow air to pass through when open and block air flow when closed. All louvers 321, 322, and 323 may be able to be opened or closed automatically, manually, or remotely. A closed louver does not allow air or fluid to pass through. An open louver allows air or fluid to pass through substantially freely. The cooling air then enters the IT rooms 301 and 302 through entrance-port louvers 322. The cooling air then is dispersed through one or more cold aisles in the IT Rooms 301 and 302 to cool IT components 311 on IT racks 310. The hot exhaust air leaves the IT rooms 301, 302 to return back to the cooling units 315. Standby unit 316 may be mounted between two groups of cooling units 315, as is illustrated in FIG. 3. Standby unit 316 may be used in multiple scenarios. For example, it may be considered as a standby unit to cool the IT components as the IT load in IT rooms 301, 302 grows. To provide cooling air to both IT rooms, both internal louvers 323 may be open, to allow air to travel freely from standby unit 316 through both sides of the cooling air supply channel 330 and through all the entrance-port louvers 322.

Standby unit 316 may also be used to service either IT room 301 or IT room 302 if either room's load increases relative to the other, or higher power equipment are actually deployed than originally planned. To service IT room 301, the right internal louver 323 (from the reader's perspective) closes and the left internal louver (from the reader's perspective) opens. This causes air flow from standby unit 316 to be pushed into IT room 301. This allows for increased cooling capacity. The opposite may also be true: to service IT room 302, the left internal louver 323 (from the reader's perspective) closes and the right internal louver (from the reader's perspective) opens. This causes air flow from standby unit 316 to be pushed into IT room 302. Standby unit 316 may be larger than the other cooling units 315 so that it has a larger cooling capacity than the other cooling units 315.

Another configuration may be that the standby unit 316 may be used as a back unit and therefore the two groups of cooling units (e.g., the four on the left side and the four on the right side) may share the back unit (e.g., standby unit 316). This may save the initial capital cost on a backup system as well as save corresponding floor space. If standby unit 316 is sufficiently large, it may be able to serve more than two IT rooms, thus saving more cost. The internal louvers 323 may be used for controlling the air flow supplied from the standby unit 316. When the standby unit 316 is idle, the supply-port louver 321 on standby unit 316 may be closed. When the standby unit 316 is on, the supply-port louver 321 on standby unit 316 may be open. The configuration illustrated by FIG. 3 may allow the load on the IT room to increase over time, or allow to populating higher power IT equipment. For example, with the standby unit 316 and the associated structure, the number of IT components and power generated by the IT components may be able to safely increase to 50% over what was originally planned for the data center.

Figure 4:
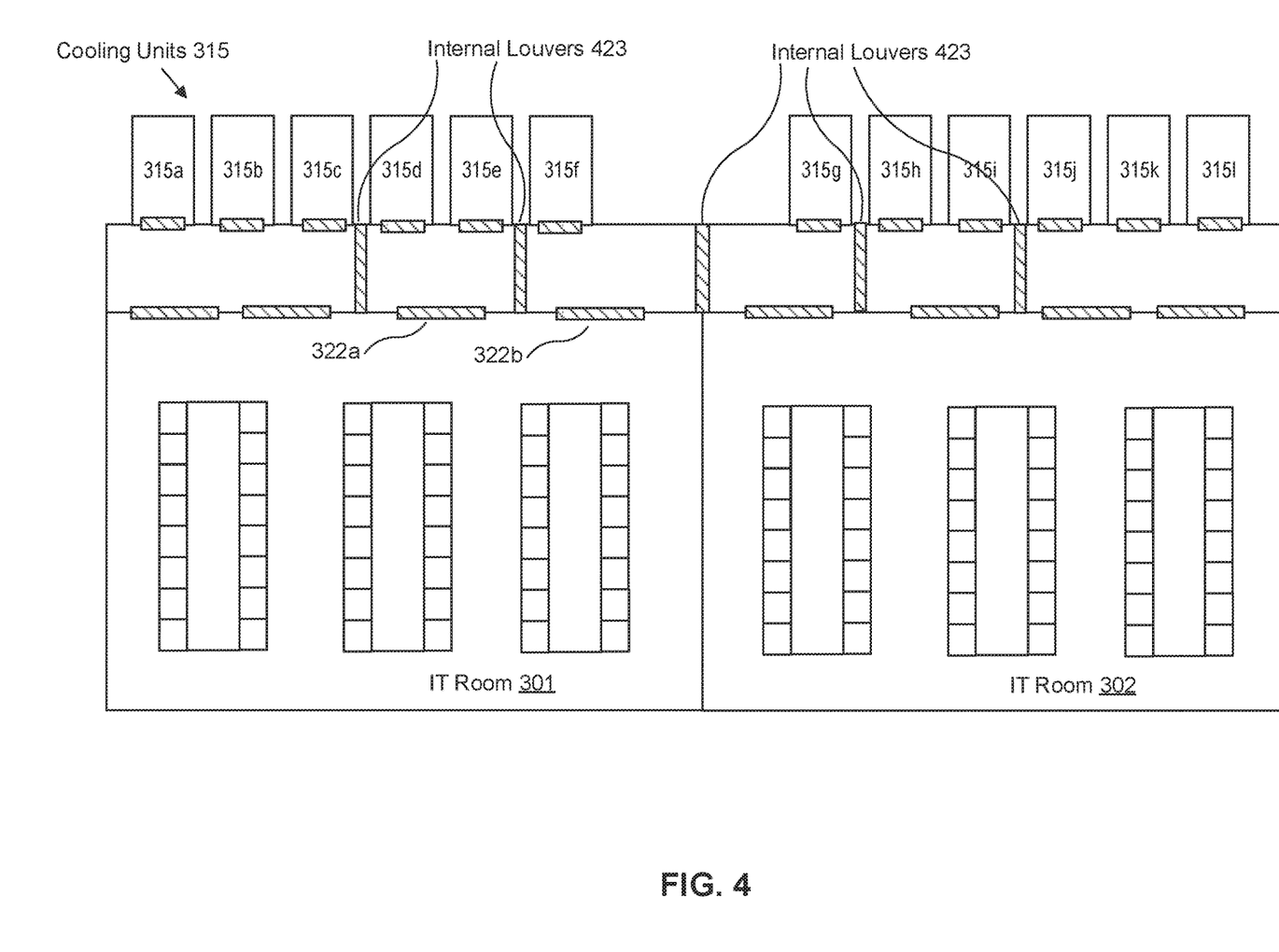
FIG. 4 is a block diagram illustrating an example dynamically adjustable cooling system according to one embodiment of the invention.

FIG. 4 is a block diagram illustrating an example dynamically adjustable cooling system and managing cooling airflow according to one embodiment of the invention. FIG. 4 illustrates a dynamically adjustable cooling system that uses several internal louvers 423 inside the cooling air supply channel. It needs to be motioned that the louvers on the edge of the cooling air supply channels need to be adjusted in combination with louvers 423 in different scenarios. The room configuration may be similar to that of FIG. 3, with the exception that no standby unit is present. Internal louvers 423 may be used to direct the air flow toward IT room 301 or 302 depending on the open-close configuration of the internal louvers 423. For example, to direct most of the cooling air toward room 302 instead of room 301, the leftmost internal louvers 423 may be closed, and the rest of the internal louvers 423 may be opened. Entrance-port louvers 322a and 322b may be closed, thus blocking off air flow to IT Room 301. Thus, IT room 301 may be cooled only by three cooling units 315a-c. And IT room 302 may be cooled by nine cooling units 315d-l. Therefore, the cooling airflow are managed and dispatched based on actual load scenarios in the IT room. Other configurations are possible. For example, if the second-from-the-left internal louver 423 is closed, entrance-port louver 322a is open, entrance-port louver 322b is closed, and the rest of the louvers are open, IT room 301 may be cooled by cooling units 315a-e, and IT room 302 may be cooled by cooling units 315f-l. The internal louvers 423 may be arranged in any configuration and there may be more or fewer than five internal louvers 423, as is illustrated in FIG. 4.

For the configuration of FIG. 4 to function properly, there may need to be some buffer room in the cooling units 315. This may mean that the cooling units 315 may not operate at max capacity when configured in the original configuration (e.g., cooling units 315a-f cooling IT room 301 and cooling units g-l cooling IT room 302). Additionally, the data center room may be designed based on peak IT power load, which may mean that the cooling capacity deployed should be capable of handling the cooling requirements at potential peak power. However, not all the IT racks may be populated at the maximum load or can be operated at the maximum power. Thus, some portion of the cooling capacity may not be utilized. The configuration shown in FIG. 4 may utilize the cooling capacity more efficiently. For example, if IT room 301 were populated with high power density IT components (e.g., for artificial intelligence) and IT room 302 is not populated with high power density IT components (e.g., for search), the cooling capacity in IT room 301 may need to be larger than the cooling capacity in IT room 302. In this case, more cooling air may need to flow into IT room 301 by appropriately opening and the louvers 423, 322, and 321, as discussed above. Additionally, the two groups of cooling units (e.g., 315a-f; and 315g-l) may be backup units for each other. For example, if IT Room 301 requires no cooling, all of the cooling units 315 may service IT room 302 by closing the entrance-port louvers 322 which connect to IT room 301.

Figure 5:
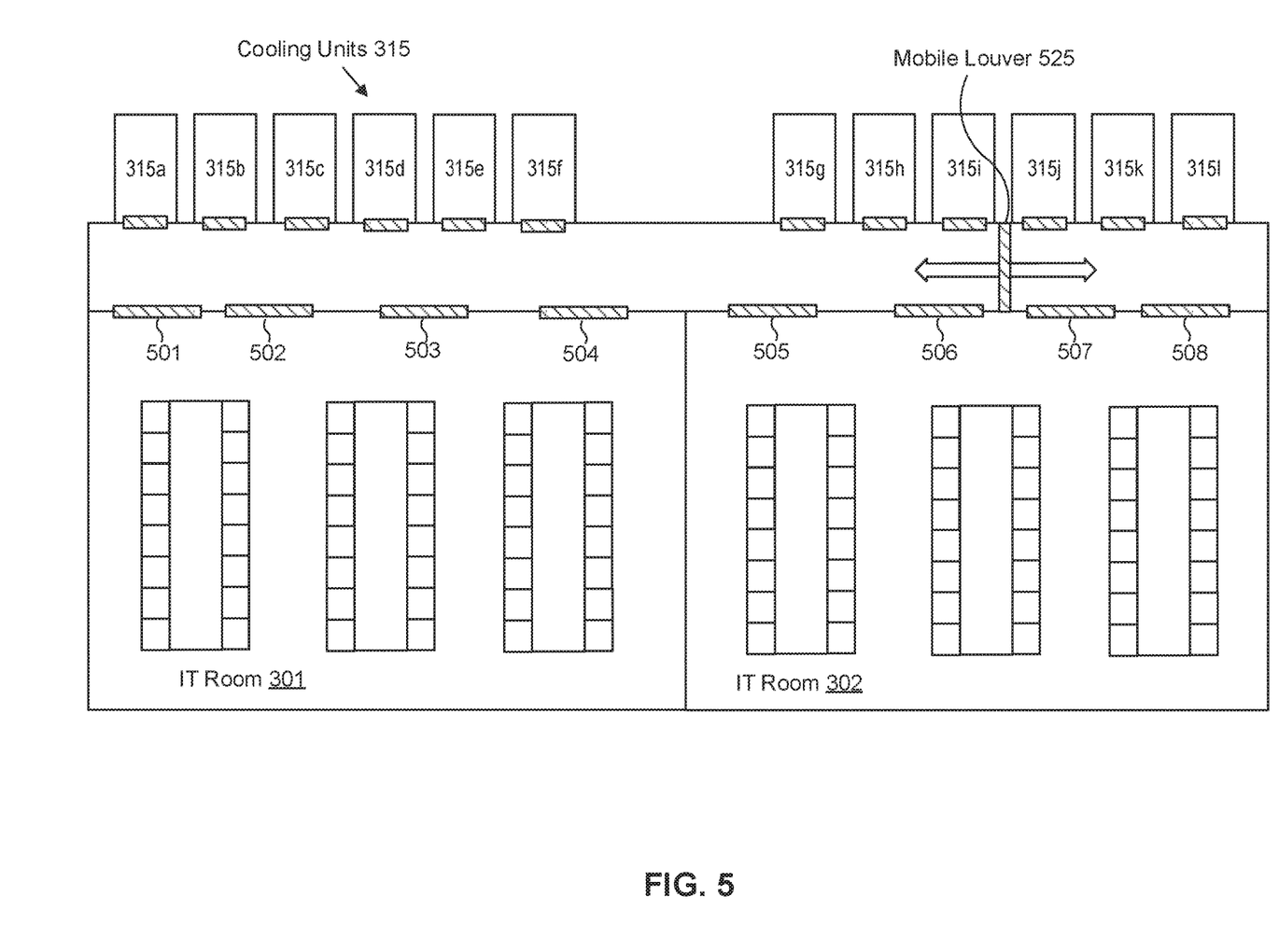
FIG. 5 is a block diagram illustrating an example dynamically adjustable cooling system according to one embodiment of the invention.

FIG. 5 is a block diagram illustrating an example dynamically adjustable cooling system according to one embodiment of the invention. In the configuration of FIG. 5, a mobile louver 525 is provided within the cooling air supply channel 330 in place of multiple stationary internal louvers (e.g., internal louvers 423). Like the other internal louvers, the mobile louver 525 may be oriented perpendicular to the walls of the cooling air supply channel 330. The mobile louver 525 may be able to move across the cooling air supply channel 330 to different locations. Any location within the cooling air supply channel 330 may be possible. The mobile louver 525 may be used to block air flow by closing its vanes. For example, when IT room 301 and IT room 302 have identical cooling needs, the mobile louver 525 may be positioned between the two IT rooms 301, 302, at the center of cooling air supply channel 330. It may be in the closed position, so that cooling units 315a-f cool IT room 301 and cooling units 315g-l cool IT room 302. As another example, to configure the dynamically adjustable cooling system so that IT room 301 is serviced by cooling units 315a-i, the mobile louver 525 may be positioned between entrance-port louvers 506 and 507, as is illustrated in FIG. 5. The vanes of mobile louver 525 may be closed. Also, entrance-port louvers 505 and 506 may be closed as well. All the other louvers may be open. Louver 525 may be open or partially open. Multiple other configurations may be possible by moving mobile louver 525 to different locations and opening and closing the appropriate entrance-port louvers 501-508.

Figure 6A:
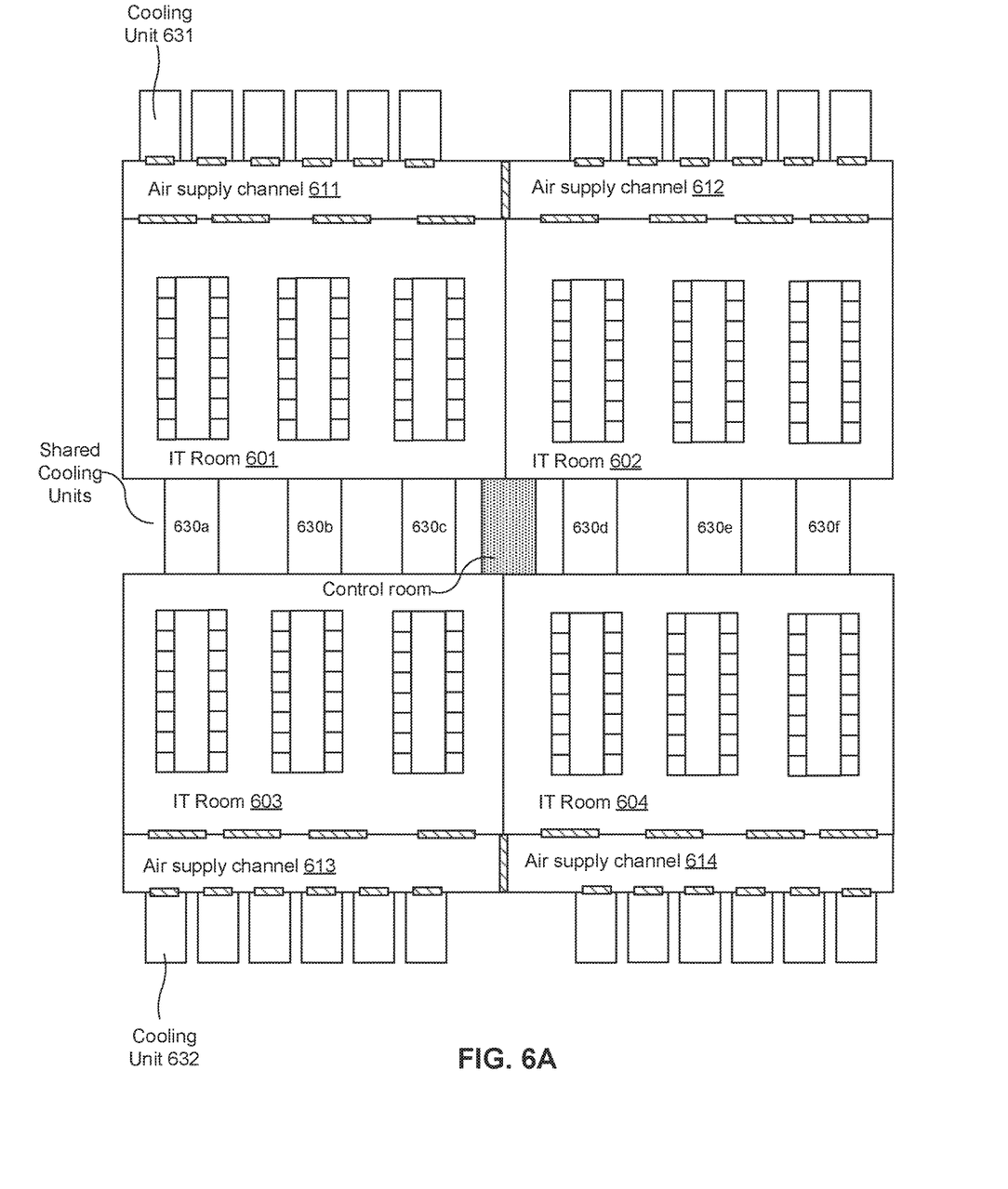
FIGS. 6A and 6B are block diagrams illustrating an example dynamically adjustable cooling system according to certain embodiments of the invention.
Figure 6B:
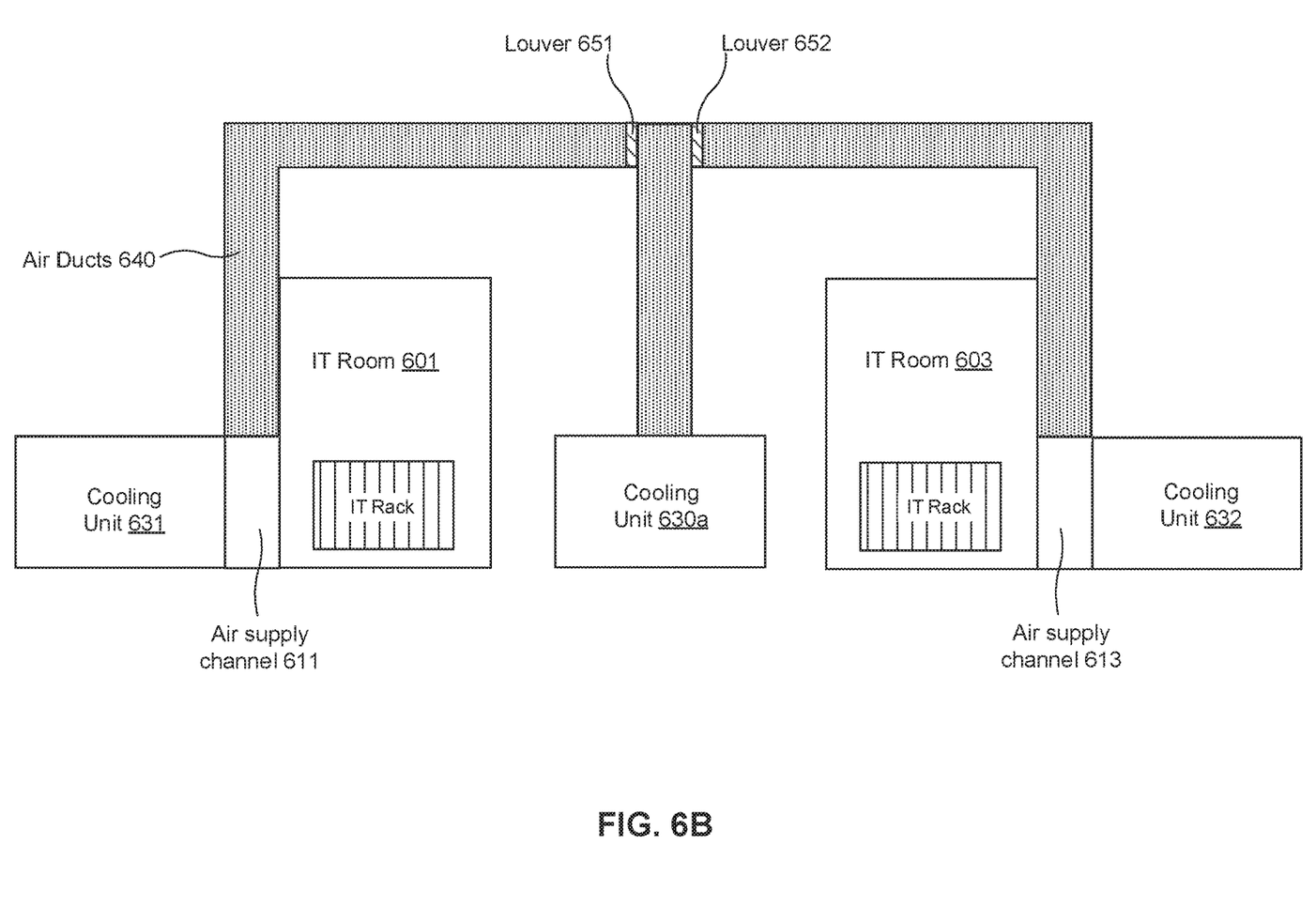

FIG. 6A is a block diagram illustrating an example dynamically adjustable cooling system according to one embodiment of the invention. FIG. 6A illustrates what may be considered to be a full building or a full module/campus level design. Four IT rooms 601-604 and four associated sets of cooling units are illustrated. Further, shared cooling units 630a-f may be positioned between IT rooms 601 and 603, and IT rooms 602 and 604, respectively. An air duct system may be used for directing the airflow supplied by the shared cooling units 630a-f to either the top or bottom IT rooms. For example, shared cooling unit 630a may be used to cool IT room 601 or 603 using air ducts, as illustrated in FIG. 6B. Each of the shared cooling units 630a-f may be used in to direct air flow two their corresponding IT room 601, 602, 603, and 604, or to any of the IT rooms 601-604. For example, shared cooling unit 630a may be used to cool IT room 602 by closing the entrance-port louvers in air supply channel 611 and opening the internal louver separating air supply channels 611 and 612. By this design, any of the shared cooling units 630a-f may push air through any of the air supply channels 611-614 and cool any of the IT rooms 601-604. It needs to be motioned that the air ducting system among the shared cooling units and the cooling air channels are not shown in FIG. 6A.

FIG. 6B is a block diagram illustrating a side view of the dynamically adjustable cooling system illustrated in FIG. 6A. Cooling air moves from cooling unit 630a up through air ducts 640. If louvers 651 and 652 are both open, then the air may move equally toward IT room 601 and IT room 602. If louver 652 is closed and louver 651 is open, the cooling air will travel to IT room air supply channel 611. If louver 652 is open and louver 651 is closed, the cooling air will travel to air supply channel 613. Once the cooling air reaches air supply channel 611 or air supply channel 613, the louvers inside the air supply channels 610-614 may dictate which IT room 601-604 enters, as illustrated and discussed with reference to FIGS. 3-5. The concept can be extended to be used for multiple data center modules or rooms, while in FIG. 6B, only two rooms are presented.

The design shown in FIG. 6A also saves the space of the air supply channel on the other side of the IT room. It can be seen that only one side of the IT room is design with an air supply channel. The air supply channel may occupy a large amount of the floor space. The current design saves the space for both two sides of the IT room.

Figure 7:
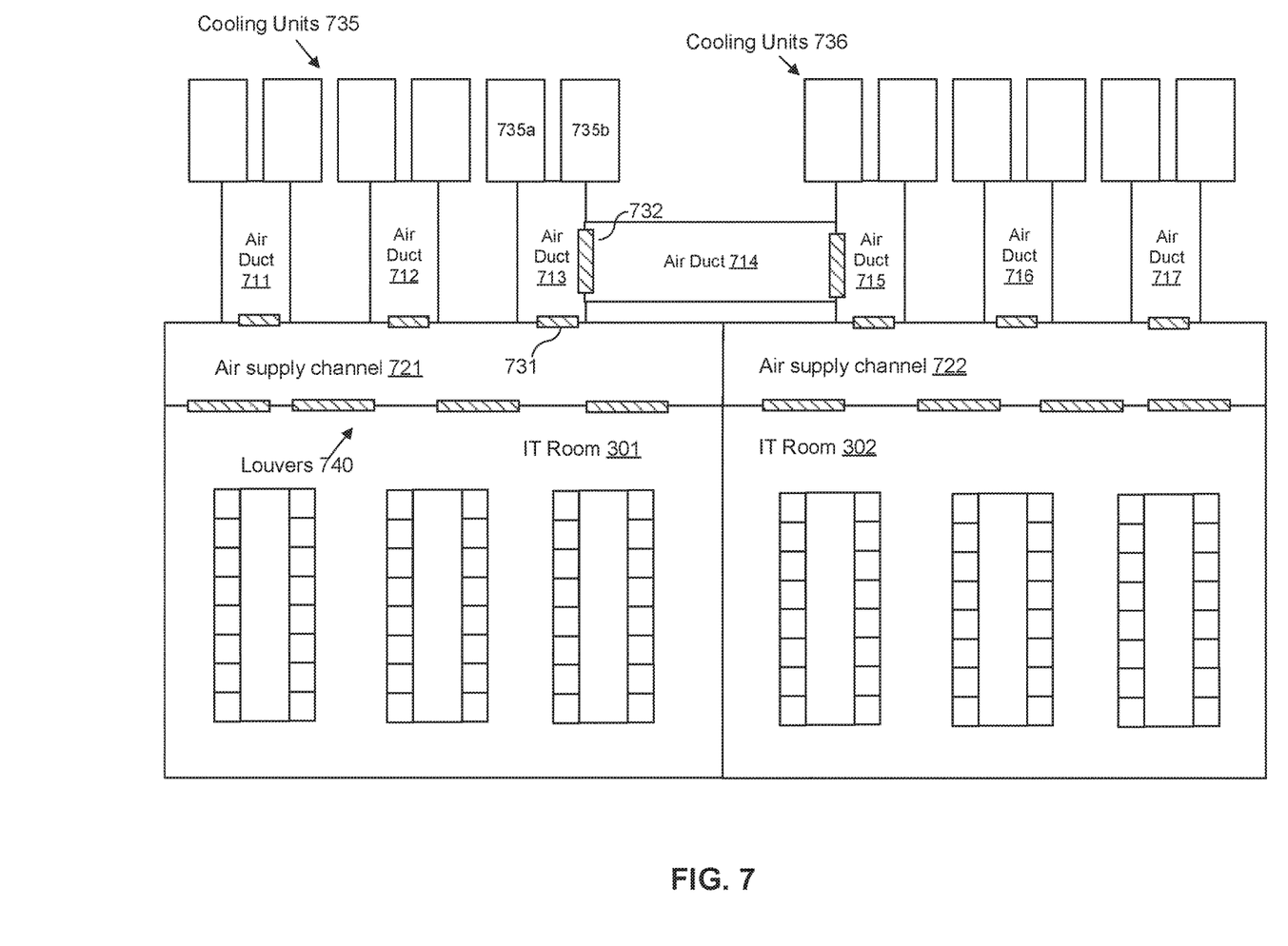
FIG. 7 is a block diagram illustrating an example dynamically adjustable cooling system according to one embodiment of the invention.

FIG. 7 is a block diagram illustrating an example dynamically adjustable cooling system according to one embodiment of the invention. FIG. 7 shows a design using an additional air duct system using air ducts 711-717. In this configuration, instead of a direct connection of the cooling units and the cooling air supply channel, the air ducts 711-717 may be used for connecting the cooling units and the air supply channels 721, 722. As can be seen in FIG. 7, an additional air duct 714 is used between air duct 713 and air duct 715. Two louvers are used on either side of air duct 714. By opening and closing various louvers, the cooling air produced by cooling units 735 and 736 may be directed in many different directions. For example, cooling units 735a and 735b may be used to cool IT room 302 by opening louver 732 and closing louver 731. This may direct the cooling air through air duct 714 into air supply channel 722 and into IT room 302. Note that a mobile louver may be implemented in air supply channels 721 and 722, and may function similarly to mobile louver 525.

The concept provided in the current invention can be extended to other data center layouts, not only limited to the ones shown in the figures. The idea is by applying the current concept, the cooling unit as well as the cooling airflow can be managed and dispatched to multiple locations (IT rooms, IT modules and so on) due to IT load variations, deployment plan variations, and also can be used for redundancy design consideration.

In another embodiment, the cooling air channel such as 330 together with the louvers as well as the air ducting systems as 714 and 640 can be designed either as one part of the building or separate modules. The corresponding louvers can be considered as a component of the air ducting module or supply air channel. In this method, these modules can be prefabricated in the manufacture and then shipped to the data center site for installation. This will increase the deployment efficiency. In addition, these modules can be standardized which means the airflow management and dispatching configurations can be also standardized. For example, one air supply channel can be configured as 30%-70%, 40%-60%, 50%-50% in terms of the airflow or cooling capacity, regardless of the cooling units deployed. In addition, although this disclosure discusses air flow management, other forms of cooling may be used as an alternative to air cooling or in combination with air cooling, such as liquid cooling.

The configurations illustrated and discussed herein are examples only. Other configurations may include side supply (e.g., cooling units are located on the side of the IT rooms), ceiling return; ceiling supply, ceiling return; ceiling supply, ceiling return, or any supply and return combination. Additionally, different types of separation methods may be applied. The methods and systems discussed herein may be used for handling non-uniform IT conditions, data center upgrading, redundancy design, and so forth. Other air flow management devices in addition to louvers may be implemented (e.g., valves). The cooling units may be IDEC units or direct air cooling system units and may receive similar results to each other.

Figure 8:
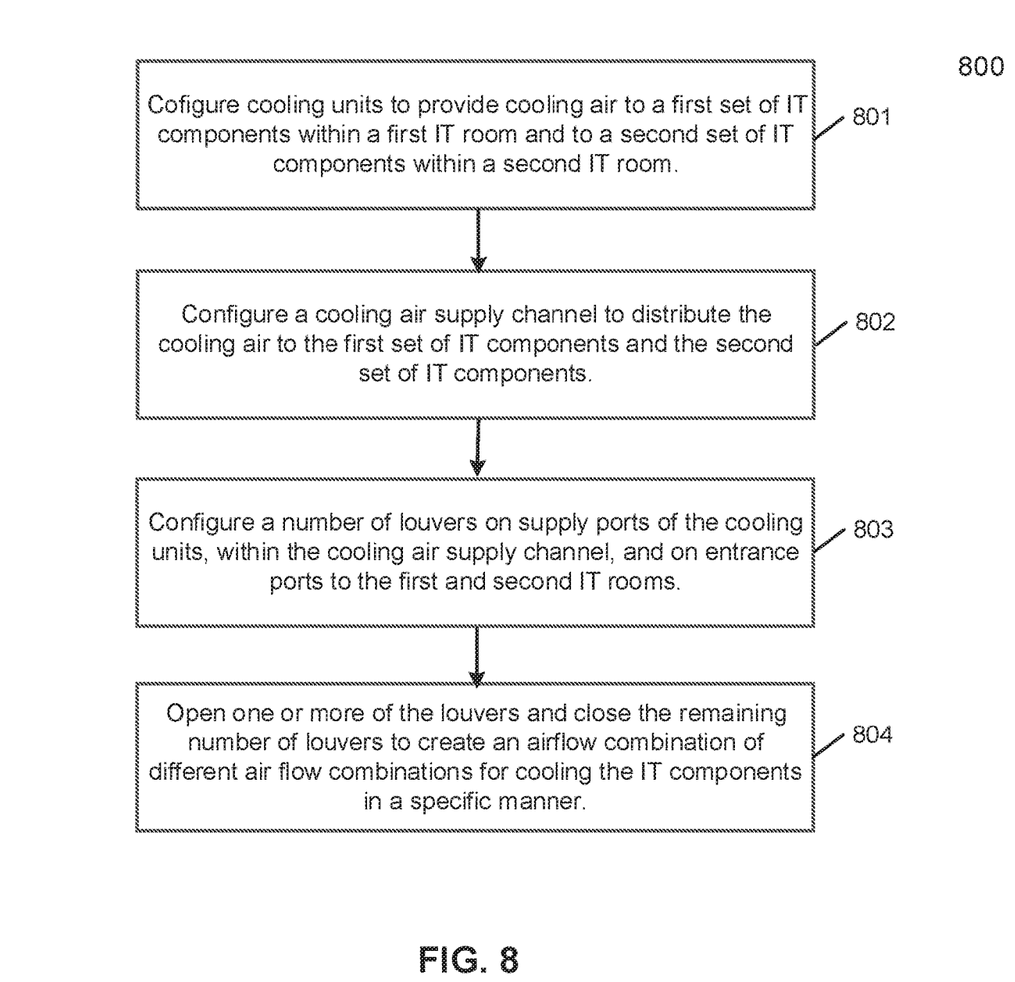
FIG. 8 is a flow diagram illustrating a process of managing airflows for data center cooling according to one embodiment.

FIG. 8 is a flow diagram illustrating a process of managing airflows for data center cooling according to one embodiment. Process 800 may be performed by processing logic which may include software, hardware, or a combination thereof. Referring to FIG. 8, at block 801, a number of cooling units are configured to provide cooling air to a first set of IT components of a first IT room and a second set of IT components of a second IT room. At block 802, a cooling air supply channel is configured to distribute the cooling air to the first and second sets of IT components. A number of louvers are configured on supply ports of the cooling units, within the cooling air supply channel, and on entrance ports of the first and second IT rooms. At block 804, processing logic individually open and close the louvers to create an airflow combination of different airflow combination for cooling the IT components in a specific manner.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A data center cooling system, comprising:
    a first information technology (IT) room having a first set of electronic racks, each of the electronic racks in the first set comprising first IT components therein;
    a second IT room having a second set of electronic racks, each of the electronic racks in the second set comprising second IT components therein;
    a cooling air supply channel fluidly coupled to each of the first IT room and the second IT room, wherein the cooling air supply channel is external to the first IT room and the second IT room;
    a first plurality of cooling units, wherein each cooling unit in the first plurality of cooling units is fluidly coupled to the cooling air supply channel;
    a second plurality of cooling units, wherein each cooling unit in the second plurality of cooling units is fluidly coupled to the cooling air supply channel; and
    a plurality of louvers installed at different locations relative to the first and second pluralities of cooling units and the cooling air supply channel, the plurality of louvers comprising:
        at least one first louver on each of one or more supply ports of the first and second pluralities of cooling units, at least one first louver to regulate cooling air entering the cooling air supply channel,
        one or more second louvers within the cooling air supply channel, the one or more second louvers to differentiate cooling air supplied to the first IT room and the second IT room based on specific heat removal needs, and
        at least one third louver on each of one or more entrance ports to the first IT room and the second IT room;
    wherein each of the plurality of louvers is operable to be opened and closed independently to create a plurality of different air flow combinations for cooling the first IT components and the second IT components based on the specific heat removal needs thereof.

2. The data center cooling system of claim 1, wherein:
    one of the plurality of cooling units is designated as a standby cooling unit to provide cooling air to the first IT components or to the second IT components; and
    a first air flow combination of the plurality of different air flow combinations comprises an open first louver located between the standby cooling unit and the first IT room and a closed second louver located between the standby cooling unit and the second IT room.

3. The data center cooling system of claim 1, wherein a first air flow combination of the plurality of different air flow combinations comprises closing off a first section of the cooling air supply channel by closing one or more of the plurality of louvers such that cooling air is blocked from flowing to the first section.

4. The data center cooling system of claim 1, wherein a first louver of the plurality of louvers is a mobile louver capable of sliding along the cooling air supply channel and oriented perpendicular to the walls of the cooling air supply channel.

5. The data center cooling system of claim 4, wherein the mobile louver is configured to be positioned such that, when closed, the mobile louver closes off a first section of the cooling air supply channel by restricting air flow to the first section.

6. The data center cooling system of claim 1, wherein:
a first cooling unit of the plurality of cooling units is located between the first IT room and the second IT room;
the cooling air supply channel extends from the first cooling unit to both the first IT room and the second IT room;
a first louver is located between the first cooling unit and the first IT room;
a second louver is located between the first cooling unit and the second IT room; wherein:
to provide cooling air to the first IT room, the second louver closes to shut off air flow to the second IT room; and
to provide cooling air to the second IT room, the first louver closes to shut off air flow to the first IT room.

7. The data center cooling system of claim 1, wherein some of the plurality of louvers are opened and some of the plurality of louvers are closed in an arrangement that is based on a first cooling need of the first IT room and a second cooling need of the second IT room.

8. The data center cooling system of claim 1, wherein the cooling air supply channel is included between the first plurality of cooling units and the second plurality of cooling units for air to flow through before entering the first IT room and the second IT room.

9. The data center cooling system of claim 1, wherein the one or more second louvers within the cooling air supply channel defines a plurality of sections of the cooling air supply channel.

10. A method for cooling a data center, comprising:
configuring a cooling air supply channel to distribute cooling air to a first set of information technology (IT) components within a first IT room and to a second set of information technology (IT) components within a second IT room, wherein the cooling air supply channel is external to the first IT room and the second IT room;
fluidly coupling a first plurality of cooling units to the cooling air supply channel;
fluidly coupling a second plurality of cooling units to the cooling air supply channel; and
positioning a plurality of louvers relative to the first and second pluralities of cooling units and the cooling air supply channel, wherein the positioning comprises:
positioning at least one first louver on each of one or more supply ports of the first and second pluralities of cooling units, the at least one first louver to regulate cooling air entering the cooling air supply channel,
positioning one or more second louvers within the cooling air supply channel, the one or more second louvers to differentiate cooling air supplied to the first IT room and the second IT room based on specific heat removal needs, and
positioning at least one third louver on each of one or more entrance ports to the first IT room and the second IT room; and
opening one or more of the plurality of louvers and closing, a remaining number of louvers to create a first air flow combination of a plurality of different air flow combinations for cooling the first set of IT components and the second set of IT components in a specified manner.

11. The method of claim 10, wherein:
one of the plurality of cooling units is designated as a standby cooling unit to provide cooling air to the first IT components or to the second IT components; and
the first air flow combination of the plurality of different air flow combinations comprises an open first louver located between the standby cooling unit and the first IT room and a closed second louver located between the standby cooling unit and the second IT room.

12. The method of claim 10, wherein the first air flow combination of the plurality of different air flow combinations comprises closing off a first section of the cooling air supply channel by closing one or more of the plurality of louvers such that cooling air is blocked from flowing to the first section.

13. The method of claim 10, wherein a first louver of the plurality of louvers is a mobile louver capable of sliding along the cooling air supply channel and oriented perpendicular to the walls of the cooling air supply channel.

14. The method of claim 13, wherein the mobile louver is configured to be positioned such that, when closed, the mobile louver closes off a first section of the cooling air supply channel by restricting air flow to the first section.

15. The method of claim 10, wherein:
a first cooling unit of the plurality of cooling units is located between the first IT room and the second IT room;
the cooling air supply channel extends from the first cooling unit to both the first IT room and the second IT room;
a first louver is located between the first cooling unit and the first IT room;
a second louver is located between the first cooling unit and the second IT room; wherein:
to provide cooling air to the first IT room, the second louver closes to shut off air flow to the second IT room; and
to provide cooling air to the second IT room, the first louver closes to shut off air flow to the first IT room.

16. The method of claim 10, wherein some of the plurality of louvers are opened and some of the plurality of louvers are closed in an arrangement that is based on a first cooling need of the first IT room and a second cooling need of the second IT room.

* * * * *